(12) United States Patent
Hashimoto et al.

(10) Patent No.: US 9,525,836 B2
(45) Date of Patent: Dec. 20, 2016

(54) AD CONVERSION APPARATUS, SOLID-STATE IMAGING APPARATUS, AND IMAGING SYSTEM

(71) Applicant: CANON KABUSHIKI KAISHA, Tokyo (JP)

(72) Inventors: Seiji Hashimoto, Yokohama (JP); Hirofumi Totsuka, Fujisawa (JP); Takeru Suzuki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/736,011

(22) Filed: Jun. 10, 2015

(65) Prior Publication Data

US 2015/0372688 A1 Dec. 24, 2015

(30) Foreign Application Priority Data

Jun. 18, 2014 (JP) ................................ 2014-125206

(51) Int. Cl.

| | |
|---|---|
| *H04N 5/378* | (2011.01) |
| *H03M 1/14* | (2006.01) |
| *H03M 1/46* | (2006.01) |
| *H04N 5/335* | (2011.01) |
| *H04N 5/355* | (2011.01) |

(Continued)

(52) U.S. Cl.
CPC ............. *H04N 5/378* (2013.01); *H03M 1/144* (2013.01); *H03M 1/466* (2013.01); *H03M 1/56* (2013.01); *H03M 1/785* (2013.01); *H04N 5/335* (2013.01); *H04N 5/355* (2013.01)

(58) Field of Classification Search
CPC ........ H04N 5/355; H04N 5/378; H04N 5/335; H03M 1/00–1/645

See application file for complete search history.

(56) References Cited

U.S. PATENT DOCUMENTS

| | | |
|---|---|---|
| 4,523,807 A | 6/1985 | Suzuki |
| 4,922,138 A | 5/1990 | Hashimoto et al. |
| 5,119,202 A | 6/1992 | Hashimoto et al. |

(Continued)

FOREIGN PATENT DOCUMENTS

| | | |
|---|---|---|
| JP | 2002-232291 A | 8/2002 |
| JP | 2010-239604 A | 10/2010 |

*Primary Examiner* — Abdelaaziz Tissire
(74) *Attorney, Agent, or Firm* — Fitzpatrick, Cella, Harper & Scinto

(57) ABSTRACT

Provided is an AD conversion apparatus including: a reference signal generating circuit configured to output a first reference signal and a second reference signal, whose voltages change with time; a comparison circuit configured to perform a comparison between a voltage of the analog signal and the voltage of the first reference signal; a control circuit configured to generate and output digital data based on the comparison; a digital-to-analog converter configured to generate, using the second reference signal, a signal whose voltage changes with time from a comparison base voltage, the comparison base voltage being based on the digital data, and configured to output the signal to the comparison circuit; and a counter configured to generate a count value by measuring an elapsed time. The comparison circuit is further configured to perform a comparison between the voltage of the analog signal and the signal output from the digital-to-analog converter.

17 Claims, 10 Drawing Sheets

(51) Int. Cl.
    *H03M 1/56*    (2006.01)
    *H03M 1/78*    (2006.01)

(56) References Cited

U.S. PATENT DOCUMENTS

| | | | |
|---|---|---|---|
| 5,694,330 A | 12/1997 | Iwamura et al. | |
| 5,883,608 A | 3/1999 | Hashimoto | |
| 6,321,182 B1 | 11/2001 | Suzuki | |
| 6,344,877 B1* | 2/2002 | Gowda | H04N 5/3575 250/208.1 |
| 7,731,904 B2 | 6/2010 | Okamoto et al. | |
| 8,736,732 B2 | 5/2014 | Utsunomiya et al. | |
| 2007/0046802 A1* | 3/2007 | Ham | H04N 5/3575 348/308 |
| 2008/0136948 A1* | 6/2008 | Muramatsu | H04N 5/335 348/294 |
| 2009/0066554 A1* | 3/2009 | Lim | H03M 1/144 341/155 |
| 2009/0174442 A1* | 7/2009 | Kim | H03K 5/026 327/134 |
| 2009/0195431 A1* | 8/2009 | Snoeij | H03M 1/144 341/155 |
| 2009/0237535 A1* | 9/2009 | Okumura | H04N 5/355 348/294 |
| 2010/0231768 A1* | 9/2010 | Utsunomiya | H04N 5/374 348/302 |
| 2010/0265114 A1* | 10/2010 | Lee | H03M 1/1225 341/155 |
| 2010/0267589 A1 | 10/2010 | Okamoto et al. | |
| 2011/0037868 A1* | 2/2011 | Ota | H04N 5/357 348/222.1 |
| 2011/0096184 A1* | 4/2011 | Shioya | H04N 1/648 348/222.1 |
| 2011/0114827 A1* | 5/2011 | Yamaoka | H03K 4/026 250/214 R |
| 2011/0309235 A1* | 12/2011 | Yoshida | H03M 1/1023 250/208.1 |
| 2012/0098990 A1* | 4/2012 | Jung | H04N 5/3575 348/222.1 |
| 2012/0113286 A1* | 5/2012 | Lim | H03M 1/144 348/222.1 |
| 2012/0327279 A1* | 12/2012 | Hashimoto | H04N 5/357 348/300 |
| 2014/0293085 A1* | 10/2014 | Hashimoto | H04N 5/243 348/222.1 |
| 2014/0327800 A1* | 11/2014 | Sugawa | H03M 1/1047 348/302 |
| 2015/0109506 A1* | 4/2015 | Aibara | H04N 5/37455 348/308 |
| 2015/0236712 A1* | 8/2015 | Okura | H04N 5/378 250/208.1 |
| 2016/0212367 A1* | 7/2016 | Utsunomiya | H04N 5/374 |

* cited by examiner

AD CONVERSION APPARATUS, SOLID-STATE IMAGING APPARATUS, AND IMAGING SYSTEM

BACKGROUND OF THE INVENTION

Field of the Invention

The present invention relates to an analog-to-digital (AD) conversion apparatus, and a solid-state imaging apparatus and an imaging system that include the AD conversion apparatus.

Description of the Related Art

In Japanese Patent Application Laid-Open No. 2002-232291, a two-step AD conversion method of obtaining high-order bits and thereafter obtaining low-order bits is disclosed as a technology for reducing power consumption of an AD conversion apparatus. The AD conversion apparatus disclosed in Japanese Patent Application Laid-Open No. 2002-232291 compares a pixel signal to a staircase reference signal, and measures a count value until an output voltage of a comparator is inverted as a high-order bit. After that, a switch is brought into non-conductive to disconnect the reference signal, and a voltage of the reference signal at this time is held in a first capacitor C1. Next, a voltage obtained by superimposing a reference signal that is small in step width than the above-mentioned reference signal on the held voltage via a second capacitor C2 is input to the comparator. This voltage is compared to the pixel signal, and a count value until the output voltage of the comparator is inverted is measured as a low-order bit. The technology for realizing the two-step AD conversion in this manner is disclosed in Japanese Patent Application Laid-Open No. 2002-232291.

In the AD conversion apparatus disclosed in Japanese Patent Application Laid-Open No. 2002-232291, a signal line for supplying the reference signal for obtaining high-order bits and a signal line for supplying the reference signal for obtaining low-order bits are switched by the switch. When the signal lines are switched by the switch, noise caused by the switch may enter the signal held in the first capacitor C1. The signal held in the first capacitor C1 is used as a comparison signal for obtaining high-order bits, and hence the noise may cause deterioration in conversion accuracy. Thus, the AD conversion apparatus disclosed in Japanese Patent Application Laid-Open No. 2002-232291 may be insufficient in conversion accuracy.

SUMMARY OF THE INVENTION

According to one embodiment of the present invention, there is provided an analog-to-digital (AD) conversion apparatus configured to convert an analog signal into a digital signal, including: a reference signal generating circuit configured to output a first reference signal and a second reference signal whose voltages change with time; a comparison circuit configured to perform a comparison between a voltage of the analog signal and the voltage of the first reference signal; a control circuit configured to generate and output digital data based on the comparison; a digital-to-analog converter configured to generate, using the second reference signal, a signal whose voltage changes with time from a comparison base voltage, the comparison base voltage being based on the digital data, and configured to output the signal to the comparison circuit; and a counter configured to generate a count value by measuring an elapsed time. The comparison circuit is further configured to perform a comparison between the voltage of the analog signal and the signal output from the digital-to-analog converter. The counter obtains a first count value by measuring a time from when changing of the voltage of the first reference signal with time starts, to when a magnitude relationship between the voltage of the analog signal and the voltage of the first reference signal, which are input to the comparison circuit, is changed. The digital data has a value based on the first count value.

Further features of the present invention will become apparent from the following description of exemplary embodiments with reference to the attached drawings.

DESCRIPTION OF THE EMBODIMENTS

Figure 1:
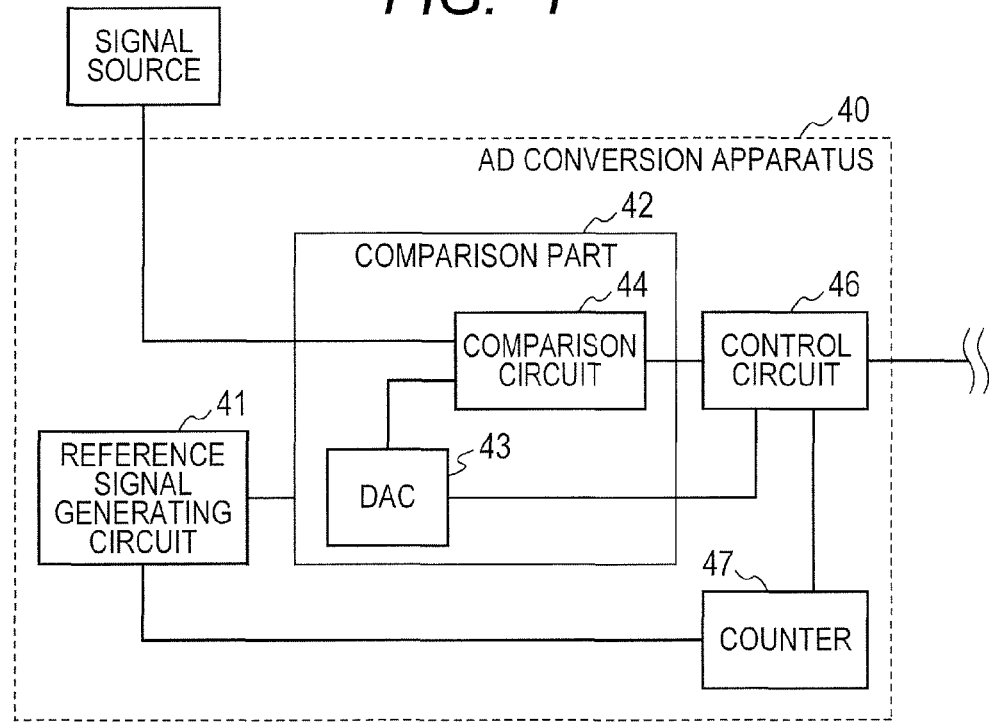
FIG. 1 is a diagram for illustrating a configuration of an AD conversion apparatus according to a first embodiment of the present invention.

Preferred embodiments of the present invention will now be described in detail in accordance with the accompanying drawings. In the drawings of the embodiments, elements having the same function are denoted by the same reference symbols, and overlapping descriptions thereof are sometimes omitted.

First Embodiment

FIG. 1 is a diagram for illustrating a configuration of an AD conversion apparatus 40 according to a first embodiment of the present invention. The AD conversion apparatus 40 according to the first embodiment is a circuit configured to convert an analog signal input from a signal source, such as a photoelectric conversion element, into a digital signal, and includes a reference signal generating circuit 41, a comparison part 42, a control circuit 46, and a counter 47.

The reference signal generating circuit 41 generates a reference signal having a voltage that changes with time. The reference signal is a signal used for comparison to a voltage of the input analog signal. For example, a ramp signal having a voltage that increases or decreases monotonically with time may be used as the reference signal.

The comparison part 42 is a circuit configured to compare the analog signal to the reference signal and output a signal based on a result of the comparison. The comparison part 42 includes a comparison circuit 44 configured to compare a magnitude relationship between input signal voltages and output a voltage corresponding to a result of the comparison, and a digital-to-analog converter 43 (hereinafter referred to as "DAC"). The comparison circuit 44 may be formed of, for example, a comparator having two input terminals and one output terminal and configured to compare a voltage of one input terminal and a voltage of the other input terminal to each other and output a binary voltage signal of any one of High level and Low level.

The counter 47 counts a time elapsed from a time at which the voltage of the reference signal starts to change, and outputs a count value to the control circuit 46. The control circuit 46 generates a control signal based on the count value obtained from the counter 47, and transmits the control signal to the comparison part 42, to thereby control the comparison part 42.

The AD conversion apparatus 40 performs two stages of AD conversion, namely, first AD conversion of executing low-resolution conversion to obtain high-order bits of the digital signal and second AD conversion of executing high-resolution conversion to obtain low-order bits of the digital signal. In other words, digital data obtained by the AD conversion is data formed of low-resolution high-order bits and high-resolution low-order bits.

The AD conversion apparatus 40 compares a voltage of the input analog signal to a voltage of a first reference signal output from the reference signal generating circuit 41, and outputs a signal indicating a magnitude relationship therebetween to the control circuit 46. The control circuit 46 obtains the count value from the counter 47, to thereby measure a time until the magnitude relationship between the two signal voltages is inverted as a first count value. In this manner, the first AD conversion is performed.

Next, a control signal based on the first count value is input from the control circuit 46 to the DAC 43. The DAC 43 outputs a DAC voltage, which corresponds to at least one subrange, to the comparison circuit 44 as a comparison base voltage indicating a voltage level of the high-order bits. The subrange used herein has a voltage range corresponding to 1 LSB in the first AD conversion. If the first AD conversion is performed for n bits, the magnitude of one subrange is $\frac{1}{2}^n$ of the range of the magnitude of the analog signal that can be converted by the first AD conversion. At this time, the reference signal generating circuit 41 outputs a second reference signal that is smaller than the first reference signal in voltage change rate with respect to time. The comparison circuit 44 compares a signal obtained by superimposing the second reference signal on the DAC voltage to the analog signal, and outputs a signal indicating a magnitude relationship therebetween to the control circuit 46. The control circuit 46 obtains a count value from the counter 47 again, to thereby measure a time until the magnitude relationship between the two signal voltages is inverted as a second count value. In this manner, the second AD conversion is performed.

In the manner described above, the AD conversion apparatus 40 performs the first and second AD conversions on the analog signal, to thereby convert the analog signal into the first and second count values. The first count value is used as data of high-order bits, and the second count value is used as data of low-order bits. Those pieces of data are combined to obtain a digital signal after AD conversion.

The DAC 43 can be formed of a circuit having various kinds of digital-to-analog conversion, such as a capacitance type DAC including a plurality of capacitors and switches and a resistance type DAC including a plurality of resistors and switches.

As described above, the AD conversion apparatus 40 according to the first embodiment of the present invention generates the comparison base voltage by the DAC 43 in order to compare the input analog signal to the second reference signal, to thereby perform AD conversion.

In this embodiment, the comparison base voltage corresponding to high-order bits is supplied from the DAC 43, and hence noise caused by a switch is not superimposed on the comparison base voltage. Consequently, the influence of the noise can be reduced to realize AD conversion with high accuracy.

Second Embodiment

Figure 2:
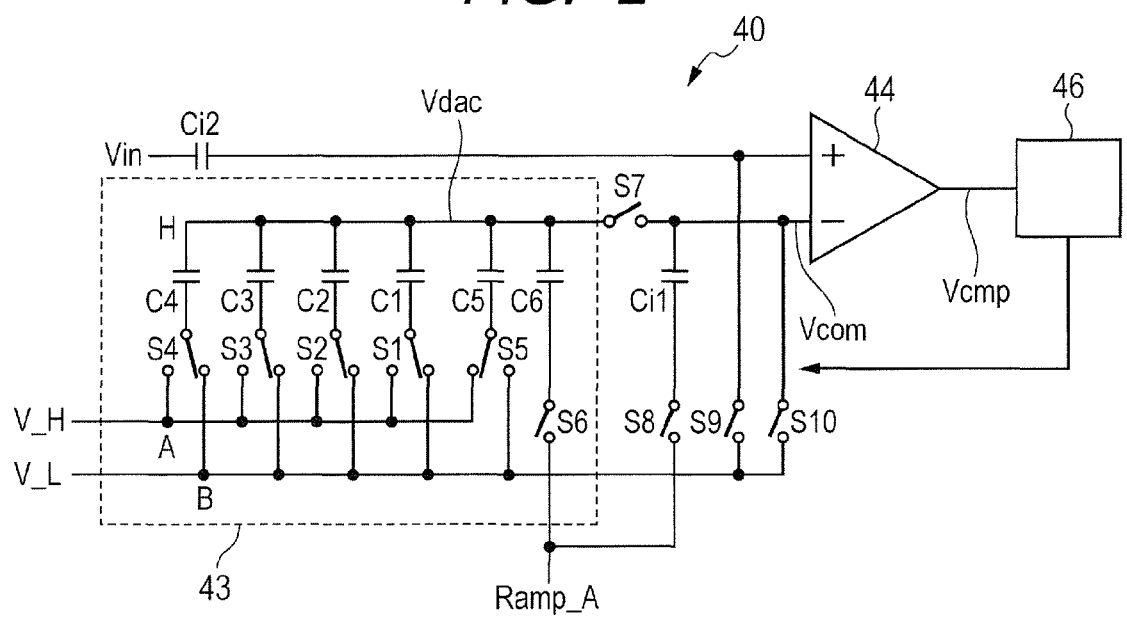
FIG. 2 is a diagram for illustrating a configuration of an AD conversion apparatus according to a second embodiment of the present invention.

FIG. 2 is a diagram for illustrating a configuration of an AD conversion apparatus 40 according to a second embodiment of the present invention. In this embodiment, the AD conversion apparatus 40 uses a capacitance type DAC 43 including a plurality of capacitors and switches, which more specifically embody the configuration of the DAC 43 in the first embodiment. In the description of this embodiment, a reference signal input to the DAC 43 is referred to as "ramp signal Ramp_A". Further, the AD conversion apparatus 40 is configured to convert an input analog signal voltage Vin into digital data of high-order 4 bits and low-order 8 bits. However, the number of bits is not limited thereto, and can be changed as appropriate. Note that, in FIG. 2, the illustration of the reference signal generating circuit 41 and the counter 47 is omitted.

The comparison circuit 44 is a differential input comparator having a non-inverting input terminal, an inverting input terminal, and an output terminal. The non-inverting input terminal inputs the analog signal voltage Vin from the signal source via a capacitor Ci2, and the inverting input terminal inputs an input voltage Vcom obtained by superimposing the ramp signal Ramp_A on a DAC voltage Vdac.

The DAC 43 is a capacitance type digital-to-analog converter including capacitors C1 to C6 and switches S1 to S6. Each of the switches S1 to S5 is a single-pole double-throw switch in which one terminal is always connected to wiring on the circuit and the other end may be selectively connected to any one of two contacts on the circuit. The switch S6 is a single-pole single-throw switch that can be selectively turned on (connected) or off (disconnected). One terminal of each of the capacitors C1 to C6 is connected to a common node H, and the other terminal thereof is connected to one side on which the corresponding one of the switches S1 to S6 is always connected. The other terminal of each of the switches S1 to S5 is configured to be selectively connected to any one of a terminal A and a terminal B. The ramp signal Ramp_A is input to the other terminal of the switch S6. The terminal A is supplied with a base voltage V_H from the reference signal generating circuit 41, and the terminal B is supplied with a base voltage V_L lower than the base voltage V_H from the reference signal generating circuit 41. The nodes H of the capacitors C1 to C6 correspond to an output terminal of the DAC 43, and the DAC voltage Vdac to be output from the output terminal has a value in the range of from V_H to V_L.

The AD conversion apparatus 40 further includes a capacitor Ci1 and single-pole single-throw switches S7 to S10. The switch S7 is connected between the output terminal of the DAC 43 and the inverting input terminal of the comparison circuit 44. The switch S9 is connected between the terminal B and the non-inverting input terminal of the comparison circuit 44. The switch S10 is connected between the terminal B and the inverting input terminal of the comparison circuit 44. One terminal of the capacitor Ci1 is connected to the inverting input terminal of the comparison circuit 44, and the other terminal thereof is connected to the switch S8.

The capacitance values of the capacitors C1 to C4 are 1 C, 2 C, 4 C, 8 C in the stated order, and therefore the capacitors C1 to C4 have binary weighted capacitance values. Specifically, when the case where each switch is connected to the terminal A is represented by "1" and the case where each switch is connected to the terminal B is represented by "0", a combined capacitance value of the capacitors C1 to C4 can be expressed by a binary number that expresses the values of the respective digits by the values "0" and "1" in combination. The capacitor C4 corresponds to the most significant bit (MSB), and the capacitor C1 corresponds to the least significant bit (LSB). For example, when the switches S2 and S3 are "1" and the switches S1 and S4 are "0", a binary number representing on/off of the switches is 0110 (6 in decimal). This corresponds to the combined capacitance value of 6 C.

In this manner, the DAC 43 can select 4 bits of capacitance values, that is, $2^4=16$ kinds of capacitance values by selecting which of the terminal A and the terminal B the respective switches are to be connected to. Consequently, the DAC 43 can input 16 kinds of DAC voltages Vdac corresponding to input digital data to the comparison circuit 44.

The capacitor C5 is connected in order to add an offset voltage to the DAC voltage Vdac so as to enable comparison to the analog signal voltage Vin. The capacitance value of the capacitor C5 is set to C/2 because an offset voltage that is half the subrange needs to be added to the comparison circuit 44.

Figure 3:
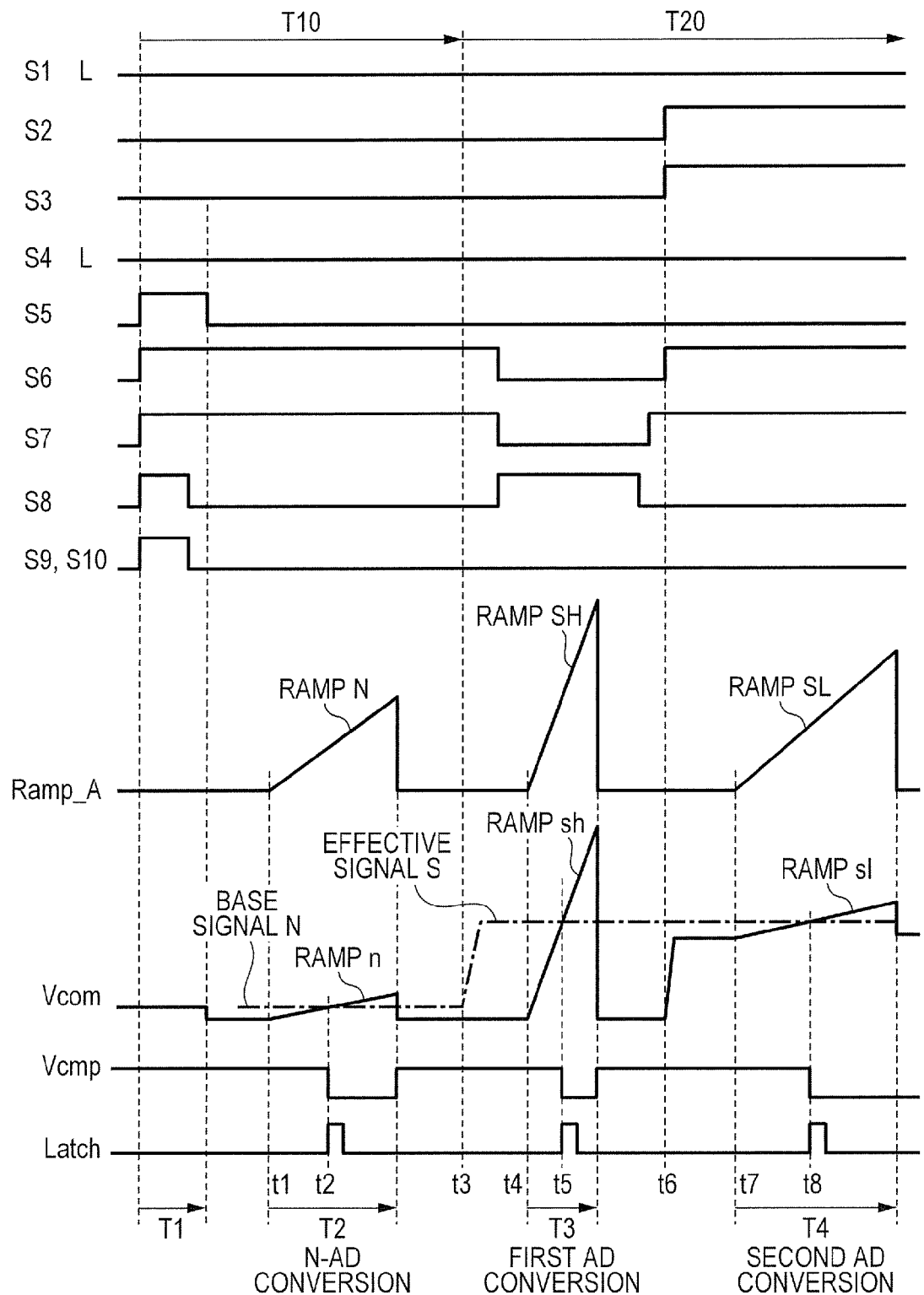
FIG. 3 is a diagram for illustrating drive timings according to the second embodiment.

Next, the AD conversion operation according to this embodiment is described with reference to a timing chart of FIG. 3. FIG. 3 is a diagram for illustrating operation timings of control signals for driving the switches S1 to S10, and changes in the ramp signal Ramp_A, the input voltage Vcom, an output voltage Vcmp, and a latch signal Latch. When the output voltage Vcmp changes from High level to Low level, the control circuit 46 generates the latch signal Latch. In this manner, a count value at that time is fetched into a memory connected on the downstream side of the control circuit 46 as digital data. A base signal N and an effective signal S, which are drawn by the dot-and-dash line and superimposed on the input voltage Vcom, represent a change in the analog signal voltage Vin output from the signal source.

A period T10 is a period of supplying the base signal N (for example, an offset voltage of the signal source), and a period T20 is a period of supplying the effective signal S superimposed on the base signal N.

A period T1 in the period T10 is a period of initializing the AD conversion apparatus 40, and a period T2 is an AD conversion period for the base signal N (N-AD conversion period). A period T3 in the period T20 is a first AD conversion period of performing AD conversion on the effective signal S, a time t6 is a time at which the DAC voltage Vdac is input to the inverting input terminal of the comparison circuit 44, and a period T4 is a second AD conversion period of performing AD conversion on a voltage difference between the DAC voltage Vdac and the effective signal S.

The ramp signal Ramp_A is a waveform having three voltage inclined portions (ramps) in which the inclination of the voltage is positive with respect to time. A voltage change in the period T2 is represented by "ramp N", a voltage change in the period T3 is represented by "ramp SH", and a voltage change in the period T4 is represented by "ramp SL". Further, the changes in the input voltage Vcom to the comparison circuit 44 in the periods T2, T3, and T4 are represented by "ramp n", "ramp sh", and "ramp sl", respectively.

When the switch S8 is turned on and the switches S6 and S7 are turned off, the ramp SH is input to the capacitor Ci1 connected to the switch S8. In this case, a change in the voltage supplied to the inverting input terminal of the comparison circuit 44 corresponds to the ramp sh. The ramp sh is used as a reference signal for the first AD conversion. The width between the maximum value and the minimum value of the ramp SH in the voltage change period (hereinafter referred to as "amplitude") is set to be substantially the same value as a voltage difference between the base voltage V_H and the base voltage V_L, which corresponds to the dynamic range of the AD conversion for the analog signal voltage Vin.

When the switch S8 is turned off and the switches S6 and S7 are turned on, the ramp N or the ramp SL is input to the capacitor C6. In this case, a change in the voltage supplied to the inverting input terminal of the comparison circuit 44 is the ramp n or the ramp sl. The ramp n and the ramp sl are the amplitudes obtained by dividing the capacitance value of the capacitor C6 based on the combined capacitance of the capacitors C1 to C5 by the ratio (C6/(C1+C2+C3+C4+C5+C6)). When the capacitance value of the capacitor C6 is represented by "1 C", the amplitudes of the ramp n and the ramp sl are about 1/16 of those of the ramp N and the ramp SL, respectively, and are substantially the same as the amplitude of the subrange. Ideally, it is preferred that the amplitude of the ramp sl be match with the subrange width. However, if the amplitude and the subrange width completely match with each other, an error may occur in setting accuracy of the DAC voltage and in a boundary region of subranges. To deal with this, in this embodiment, the second AD conversion period is lengthened to have a margin, to thereby set the amplitude so that the AD conversion may be performed in a range that covers the subrange.

The switches S9 and S10 are switches for initializing the comparison part 42. When the switches S9 and S10 are turned on, the respective input terminals of the comparison circuit and the DAC 43 are each connected to the terminal B, and are reset to the base voltage V_L.

Now, count frequencies for the ramp signal Ramp_A and the AD conversion period are described. In the N-AD conversion period T2 and the second AD conversion period T4, the ramp n and the ramp sl have the same change rate (inclination) with respect to time, and have the counter clocks CLK with the same frequencies. When the clock frequencies are the same, data obtained by the AD conversion can be handled with the same resolution. The inclination of the ramp sh in the first AD conversion period T3 is set to be four times as large as the inclination of the ramp sl in the second AD conversion period T4, and a frequency of a counter clock CLK2 in the first AD conversion period T3 is set to be ¼ of the frequency of the counter clock CLK of the second AD conversion. Note that, when the inclination of the ramp sh is increased, and the frequency of the counter clock CLK2 is increased at substantially the same ratio, the rate of the AD conversion in the first AD conversion period T3 can be increased.

Next, an operation of each switch at each operation timing is described. In the timing chart, the switches S1 to S5 are connected to the terminal B when a control signal voltage is at Low level, and connected to the terminal A when the control signal voltage is at High level. Further, the switches S6 to S10 are turned on when a control signal voltage is at High level, and the switches S6 to S10 are turned off when the control signal voltage is at Low level.

In the initialization in the period T1, the switches S6 to S10 are turned on, the switches S1 to S4 of the DAC 43 are connected to the terminal B, and the switch S5 is connected to the terminal A. In this case, the base voltage V_L is input to the non-inverting input terminal of the comparison circuit 44. In this manner, the input terminals of the comparison circuit 44 are clamped to the base voltage V_L. Further, the voltage (V_H−V_L) is applied to the capacitor C5, and the electric charges are accumulated.

In the following, for simple description, the base voltage V_L, the base signal N of the analog signal voltage Vin, and the offset voltage of the comparator are all 0 V. Further, the amplitude of the ramp sh is 1 V. The number of high-order bits is 4 bits, and hence the subrange is 62.5 mV, which is 1/16 of 1 V.

After that, the switches S8 to S10 are turned off, and then the switch S5 is connected to the terminal B instead of the terminal A. Due to the electric charges accumulated in the capacitor C5, a negative offset voltage (−31.25 mV) corresponding to ½ of the subrange is added to the input voltage Vcom, to thereby complete the initialization of the AD conversion apparatus 40 for the N-AD conversion.

At a time t1 in the period T2, the ramp n starts to change. At a time t2, when the voltage of the ramp n exceeds the voltage (0 V) of the base signal N to invert a result of the comparison, a count value counted in the period from t1 to t2 is stored in the memory connected on the downstream side of the control circuit 46 in response to a pulse of the latch signal Latch. This count value is digital data for low-order bits of the base signal N.

At a time t3, the effective signal S is input from the signal source to the comparison circuit 44. In the following, the signal voltage of the effective signal S is 420 mV. At a time t4, the first AD conversion of comparing the effective signal S to the ramp sh is started. At a time t5 at which the ramp sh exceeds 420 mV, the level of the output voltage Vcmp of the comparison circuit 44 is inverted, and the comparison circuit 44 generates a pulse of the latch signal Latch.

As described above, the data of high-order bits obtained by the first AD conversion are 4 bits, and hence the analog signal is converted into binary numbers 0000 to 1111. Analog voltage values are assigned to those binary numbers in increments of 62.5 mV. For example, the binary number 0110 (corresponding to 6 in decimal) corresponds to 62.5 mV×6=375 mV, and the binary number 0111 (corresponding to 7 in decimal) corresponds to 62.5 mV×7=437.5 mV. Because the signal voltage of the effective signal S is 420 mV, the count value (first count value) at the time t5 at which the level of the output voltage Vcmp is inverted is 0111 (corresponding to 437.5 mV).

After that, the first count value is shifted by 1 LSB, and then held in a memory connected on the downstream side of the control circuit 46 as high-order bit data. Specifically, the value of the high-order bit data is 0110, which is obtained by shifting 0111 by 1 bit. After the end of the first AD conversion period T3, the switch S8 is turned off. Subsequently, the switch S7 is turned on, and thereafter at a time t6, the switch S6 is also turned on. In this manner, the DAC voltage is input to the comparison circuit 44, and preparation for second AD conversion is completed. At the same time, the control circuit 46 controls the respective switches S4 to S1 of the DAC 43 so as to correspond to the high-order bit data 0110. As described above, the respective switches S4 to S1 correspond to the values of the respective digits of the high-order bit data, and hence in this embodiment, the switches S1 and S4 are turned off and the switches S2 and S3 are turned on. As a result, the DAC voltage, which is the output of the DAC 43, is 375 mV.

At a time t7, the ramp sl is superimposed on the DAC voltage, and the second AD conversion for the effective signal S is started, with the DAC voltage used as an initial value. In this manner, highly accurate AD conversion is performed in one subrange between 375 mV corresponding to high-order bit data 0110 and 437.5 mV corresponding to high-order bit data 0111. After that, at a time t8, when the level of the output voltage Vcmp of the comparison circuit 44 is inverted, the count value at the time t8 (second count value) is similarly held as low-order bit data of 8 bits.

After that, the high-order bit data 0110 obtained by the first AD conversion and the low-order 8-bit data obtained by the second AD conversion are combined, to thereby obtain 12-bit AD conversion data. Through processing of obtaining a difference between the 12-bit data of the effective signal S and the low-order bit data of the base signal N, digital data from which the influence of the base signal N, such as the noise of the signal source and the offset voltage of the comparison circuit, has been removed can be obtained.

The counter signal may be counted while being shifted by 1 clock so as to omit the processing of shifting the first count value, and the count value at the time when the level of the output voltage Vcmp is inverted may be directly input to the DAC 43.

The AD conversion apparatus 40 according to this embodiment is applicable to a signal readout circuit (column circuit) that is mounted for each column of a pixel part of a solid-state imaging apparatus. The number of columns of the column circuit is determined by the number of horizontal pixels in the pixel part of the solid-state imaging apparatus, and is several thousand columns, for example. In the case of such a large number of columns, a delay of the counter signal or a fluctuation of inverting timing of the comparison circuit 44 may occur. When this problem may occur, data input to the DAC 43 may be shifted by two subranges to further lengthen the AD conversion period, to thereby perform second AD conversion with two subrange widths. Alternatively, a negative offset voltage may be added to a calibration voltage of the DAC, to thereby shift the conversion range of the second AD conversion.

In this embodiment, the voltage obtained by the first AD conversion is superimposed in the second AD conversion with use of the capacitance type DAC 43. Accordingly, accuracy deterioration results from a mechanism in which noise caused by the switch at the time of switching of the reference signal of the AD conversion is held in the holding capacitor is reduced. Thus, according to the AD conversion apparatus 40 in this embodiment, highly accurate AD conversion is realized. Further, when the range of the second AD conversion is increased to be wider than one subrange width, another effect of reducing the influence of the subrange boundary on the accuracy of AD conversion can be obtained.

In this embodiment, the ramp signal Ramp_A has been exemplified as the reference signal, but a staircase waveform in which a voltage changes in a staircase manner may be used as the reference signal. The same holds true for the other embodiments.

Third Embodiment

Figure 4:
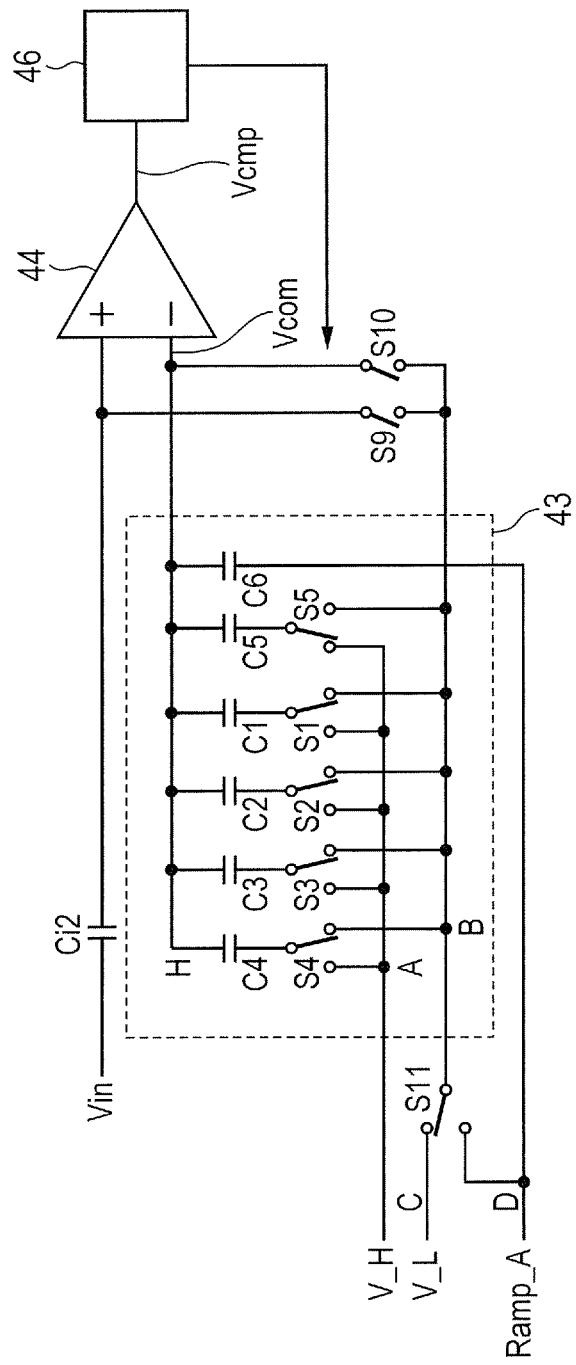
FIG. 4 is a diagram for illustrating a configuration of an AD conversion apparatus according to a third embodiment of the present invention.
Figure 5:
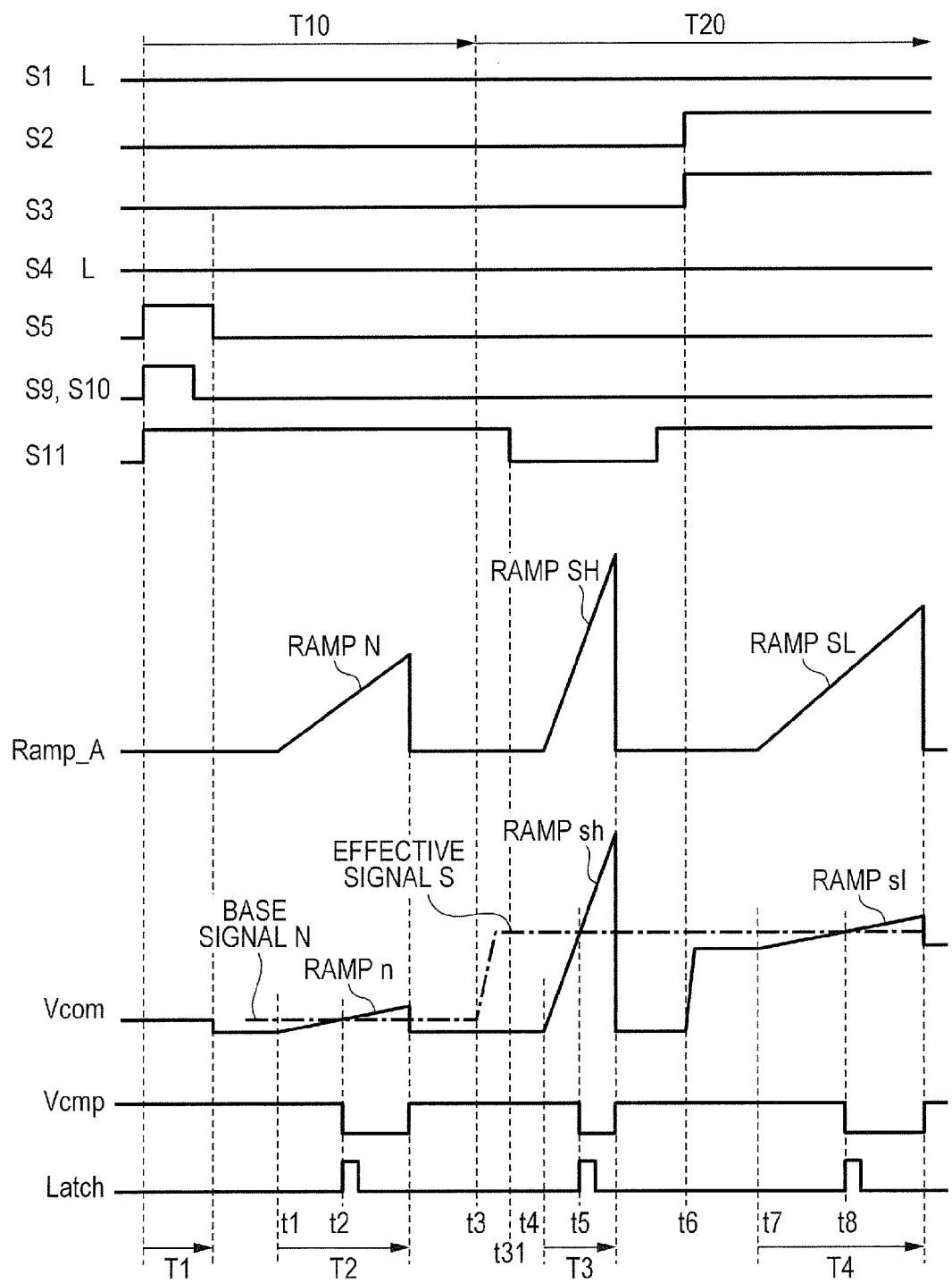
FIG. 5 is a diagram for illustrating drive timings according to the third embodiment.

FIG. 4 is a diagram for illustrating a configuration of an AD conversion apparatus 40 according to a third embodiment of the present invention, and FIG. 5 is a diagram for illustrating operation timings of the AD conversion apparatus 40 according to the third embodiment. This embodiment differs from the second embodiment in that the configurations of the switches and the capacitors used for the first AD conversion and the operation timings thereof are changed to employ a different method of generating a ramp signal. More specifically, in the first AD conversion, the ramp signal is input via the capacitor Ci1 in the second embodiment, but the ramp signal is input via a combined capacitor of the entire DAC 43 in this embodiment. The other operations are the same, and hence overlapping descriptions are omitted.

In the AD conversion apparatus 40 according to the third embodiment, the switches S6, S7, and S8 and the capacitor Ci1 are not included but a switch S11 is added as compared to the second embodiment. The switch S11 is a single-pole double-throw switch for selecting which of wiring for supplying the ramp signal Ramp_A and wiring for supplying the base voltage V_L the input terminals of the DAC 43 are to be connected. The switch S11 is used for supplying the ramp sh to the comparison circuit 44 by inputting the ramp sh to the terminal B of the DAC 43 in the first AD conversion period. Note that, the terminal B serving as the input of the DAC 43 is connected to the terminal C when a control signal of the switch S11 is at High level, and connected to the terminal D when the control signal of the switch S11 is at Low level.

In a period before a time t31, the switch S11 is connected to the terminal C, and the base voltage V_L is supplied to the terminal B of the DAC 43. The circuit in this case is the same as in the second embodiment. Accordingly, the N-AD conversion in the period T2 is performed similarly to the second embodiment.

At the time t31, the switch S11 is now connected to the terminal D instead of the terminal C. Then, all the capacitors C1 to C5 are connected to the terminal D, and the ramp signal Ramp_A is input to the DAC 43. At a time t4, when the voltage of the ramp signal Ramp_A (ramp SH) starts to change, the ramp SH is input to the inverting input terminal of the comparison circuit 44 via the capacitors C1 to C5. In this manner, the first AD conversion is performed. After the first AD conversion is completed, the switch S11 is connected again to the terminal C, that is, the base voltage V_L. The operation thereafter is the same as in the second embodiment.

In this embodiment, the same effect as in the second embodiment can be obtained, and further, the switches S7 and S8 and the capacitor Ci1 in the second embodiment can be omitted, and hence the AD conversion apparatus 40 can be downsized. Further, the switch S7 is not connected in the signal path between the DAC 43 and the comparison circuit 44, and hence the influence of switching noise caused by switching on/off of the switch can be suppressed.

Fourth Embodiment

Figure 6:
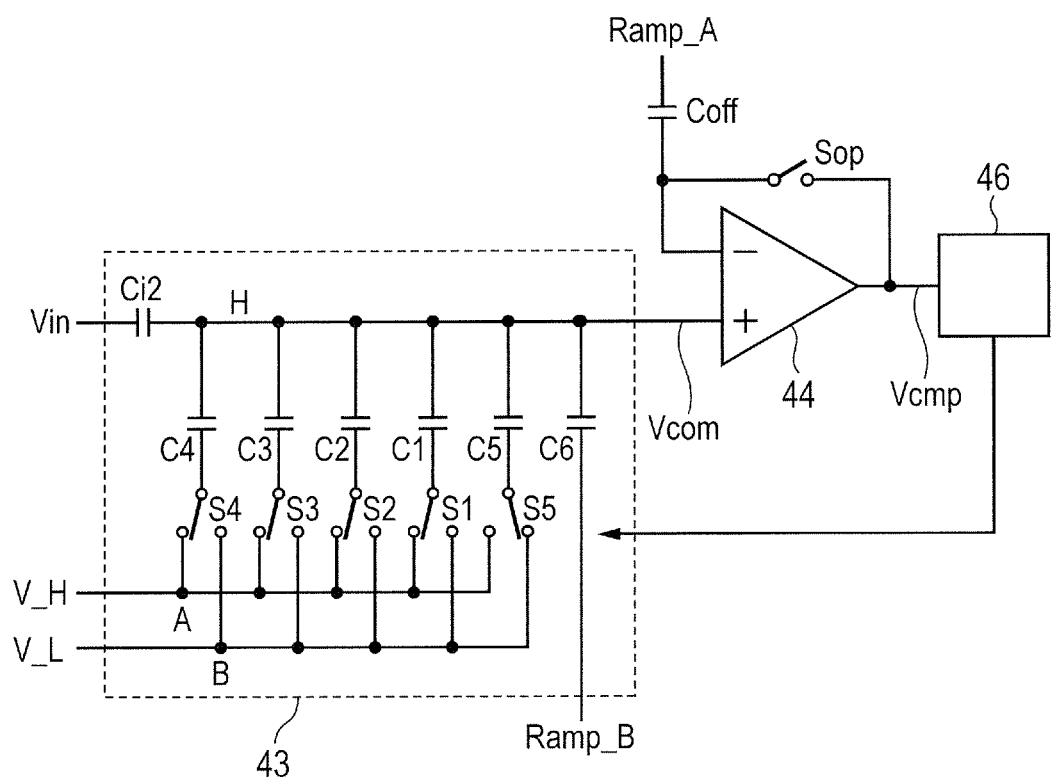
FIG. 6 is a diagram for illustrating a configuration of an AD conversion apparatus according to a fourth embodiment of the present invention.
Figure 7:
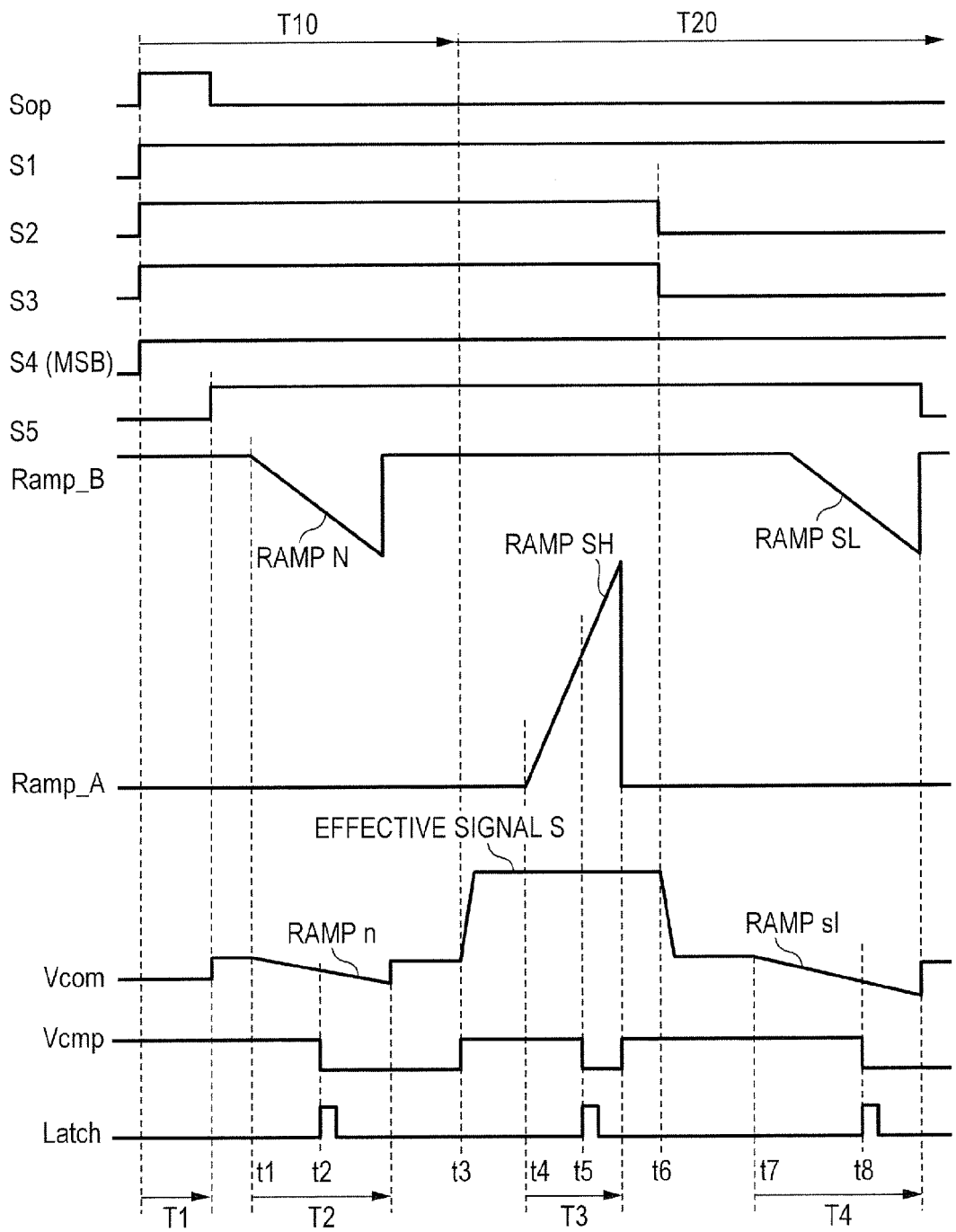
FIG. 7 is a diagram for illustrating drive timings according to the fourth embodiment.

FIG. 6 is a diagram for illustrating a configuration of an AD conversion apparatus 40 according to a fourth embodiment of the present invention, and FIG. 7 is a diagram for illustrating operation timings of the AD conversion apparatus 40 according to the fourth embodiment. In the AD conversion apparatus 40 according to this embodiment, a capacitor Coff and a switch Sop are further added to the second embodiment. On the other hand, the capacitor Ci1 and the switches S7 to S10 in the second embodiment are not included in the AD conversion apparatus 40 according to this embodiment.

The ramp signal Ramp_A is input to the inverting input terminal of the comparison circuit 44 via the capacitor Coff. The switch Sop is a single-pole single-throw switch, and is connected between the inverting input terminal and the output terminal of the comparison circuit 44. A ramp signal Ramp_B is input to the non-inverting input terminal of the comparison circuit 44 via the capacitor C6. The analog signal voltage Vin is input to the node H of the DAC 43 via the capacitor Ci2, and is input to the non-inverting input terminal of the comparison circuit 44 from the output terminal of the DAC 43. Note that, the inclinations of voltage inclined portions of the ramp signal Ramp_A and the ramp signal Ramp_B are different in sign. In this embodiment, the ramp signal Ramp_A has a ramp SH that increases monotonically with time, and the ramp signal Ramp_B has ramps N and SL that decrease monotonically with time.

In the above-mentioned second and third embodiments, the analog signal voltage Vin is input to the non-inverting input terminal of the comparison circuit 44 via the capacitor Ci2, and the DAC voltage is input to the inverting input terminal of the comparison circuit 44. On the other hand, this embodiment differs from the second and third embodiments in that both of the analog signal voltage Vin and the DAC voltage are input to the non-inverting input terminal of the comparison circuit 44. Further, the base signal N output from the analog signal source (this voltage is hereinafter referred to as "Vn") and the offset voltage of the comparison circuit 44 can be held in the capacitor Coff connected to the inverting input terminal of the comparison circuit 44. In the description of this embodiment, the ramp SH for the first AD conversion is input from one terminal of the capacitor Coff connected to the inverting input terminal, but this embodiment may be modified so that the ramp SH is input from the input terminal of the comparison circuit 44 similarly to the second and third embodiments.

Referring to FIG. 7, operation timings according to this embodiment are described. In initialization of the AD conversion apparatus 40 in an initialization period T1, the switch Sop for the comparison circuit 44 is turned on. At this time, the inverting input terminal and the output terminal of the comparison circuit 44 are short-circuited, and the comparison circuit 44 forms a voltage follower circuit. At this time, the base signal N of the analog signal source is input to the non-inverting input terminal of the comparison circuit 44, and hence a voltage Vdark obtained by superimposing the voltage of the base signal N on the offset voltage of the comparison circuit 44 is input to the capacitor Coff. After that, the switch Sop is turned off, and the voltage Vdark is held in the capacitor Coff. Further, the terminal A of the DAC 43 at this time is connected to the base voltage V_H higher than the base voltage V_L, and the input voltage Vcom of the comparison circuit is the base signal voltage Vn of the analog signal. At the end of the period T1, the switch S5 is now connected to the terminal A instead of the terminal B. In this manner, the voltage of the input voltage Vcom is increased due to the base voltage V_H input via the capacitor C5 (capacitance value C/2).

At a time t2, the ramp n is superimposed on the input voltage Vcom, and the N-AD conversion is started. Because the inverting input terminal of the comparison circuit holds the voltage Vdark due to the capacitor Coff, the N-AD conversion is not necessarily required and may be omitted. However, because an error may occur due to a delay of the comparison circuit 44 and characteristics fluctuations thereof, it is preferred to perform the N-AD conversion as in this embodiment.

At a time t3, the effective signal S of the analog signal is input to the comparison circuit 44. The input voltage Vcom at this time is 420 mV. At a time t4, the ramp SH, which is a comparison signal for the first AD conversion, starts to change. At a time t5, the level of the output voltage Vcmp of the comparison circuit 44 is inverted. Binary data as a count value at this time is 0111 (7 in decimal), and a voltage value corresponding to the binary number is 62.5 mV×7=437.5 mV. At a time t6, a binary number 0110 obtained by shifting the binary number 0111 by 1 LSB is input to the DAC 43.

In this embodiment, a combined capacitance value is expressed by the binary number in which "0" means the case where each switch is connected to the terminal A and "1" means the case where each switch is connected to the terminal B in the opposite manner to the first embodiment. When high-order bit data 0110 is input to the DAC 43, the connection destinations of the switches S2 and S3 are switched from the terminal A to the terminal B. With this, the voltage input to the capacitors C2 and C3 changes from V_H to V_L. The voltage value of the output voltage of the DAC 43 corresponding to the binary number 0110 (6 in decimal) is 62.5 mV×6=375 mV, and hence the potential decreases from 420 mV by 375 mV. Accordingly, the input voltage Vcom of the comparison circuit 44 becomes Vn+45 mV.

At a time t7, the voltage of the ramp sl starts to fluctuate, and the second AD conversion is performed in the period T4. At a time t8, the level of the output voltage Vcmp of the comparison circuit 44 is inverted, and a count value at this time is held in a memory connected on the downstream side of the comparison circuit 44 as low-order 8 bits.

When the high-order bit data 0110 obtained by the first AD conversion and the low-order 8-bit data obtained by the second AD conversion are combined, 12-bit AD conversion data is obtained. Through processing of obtaining a difference between the 12-bit data of the effective signal S and the low-order bit data of the base signal N, digital data from which the offset voltage has been removed can be obtained.

In this embodiment, the base signal voltage Vn of the analog signal and the offset voltage of the comparison circuit 44 are held in the capacitor Coff, and the AD conversion is performed with use of the resultant voltage as a base. Thus, the offset voltage superimposed on the input voltage Vcom of the comparison circuit after the period T1 becomes smaller. Consequently, the period of the ramp n is shortened as compared to the second embodiment and the third embodiment.

Fifth Embodiment

Figure 8:
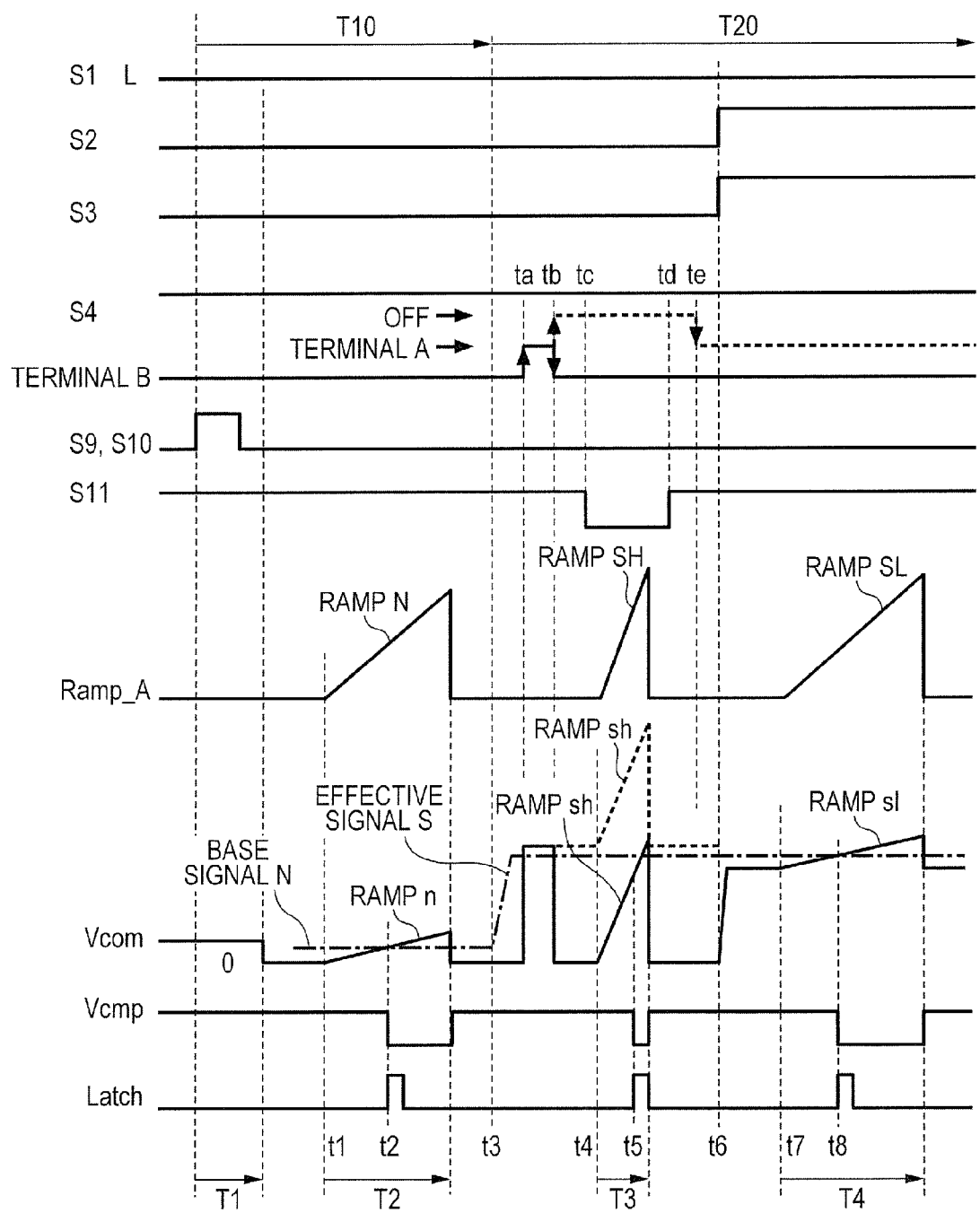
FIG. 8 is a diagram for illustrating drive timings according to a fifth embodiment of the present invention.

FIG. 8 is a diagram for illustrating operation timings according to a fifth embodiment of the present invention. This embodiment has the same circuit configuration as in the third embodiment but differs in the operation of the switch S4. In the third embodiment, when the switch S4 is switched to the terminal A or the terminal B, any one of the base voltage V_H and the base voltage V_L is input to the capacitor C4. In this embodiment, on the other hand, the switch S4 is connected to the terminal A or the terminal B, and may be further selected to be turned OFF.

In a period before a time ta, the switch S4 is connected to the terminal B similarly to the case of the third embodiment. At the time ta, the switch S4 is connected to the terminal A. A binary number corresponding to this operation is 1000 (8 in decimal), and hence the output voltage is 62.5 mV×8=500 mV. Accordingly, the DAC voltage Vdac, that is, the input voltage Vcom input to the inverting input terminal of the comparison circuit 44 increases to 500 mV. Comparison processing between the input voltage Vcom and the effective signal S is performed.

When the voltage of the effective signal S is equal to or higher than 500 mV based on the comparison between the input voltage Vcom and the voltage of the effective signal S, the data value "1" is obtained as MSB of the effective signal S, and the switch S4 is switched to be OFF at a time tb. In a period from the time tb to a time te, the input voltage Vcom is held at 500 mV by the capacitors C1 to C3, C5, and C6. In a first AD conversion period T3, comparison processing between a signal obtained by superimposing the ramp sh on the voltage of 500 mV and the effective signal S is performed. The operation after a time t6 is the same as that at the operation timing illustrated in FIG. 5 according to the third embodiment, and hence a description thereof is omitted. Note that, in FIG. 8, the operation timings of the switch S4 and the change in the input voltage Vcom after the time tb in this case are illustrated by the broken line.

When the voltage of the effective signal S is lower than 500 mV based on the comparison between the input voltage Vcom and the voltage of the effective signal S, the data value "0" is obtained as MSB of the effective signal S, and the switch S4 is connected to the terminal B again at the time tb. As a result, the input voltage Vcom drops to the base voltage V_L. In a first AD conversion period T3, comparison processing between the ramp sh and the effective signal S is performed. The operation after the time t6 is the same as the operation timing of FIG. 5 according to the third embodiment, and hence a description thereof is omitted. Note that, in FIG. 8, the operation timings of the switch S4 and the change in the input voltage Vcom after the time tb in this case are illustrated by the solid line.

As described above, in this embodiment, it is determined whether or not the voltage of the effective signal S is equal to or higher than 500 mV in the period from the time ta to the time tb as a first stage, and based on the result, the data value of the MSB is determined. After that, 3-bit data other than the MSB is obtained in the first AD conversion period T3, and the obtained 3-bit data and the data value of the MSB are combined. Then, 4-bit digital data as high-order bits can be obtained.

In this embodiment, the data of the MSB is obtained through the switching of the switch S4. Thus, the number of bits to be converted in the first AD conversion period T3 is smaller than that in the third embodiment by 1 bit, and hence the amplitude of the ramp sh is reduced to be ½, and the first AD conversion period T3 is shortened to be ½. Consequently, a required time for the AD conversion can be shortened.

Further, the amplitude of the ramp sh is small, and hence power consumption of the reference signal generating circuit is reduced.

Sixth Embodiment

Figure 9:
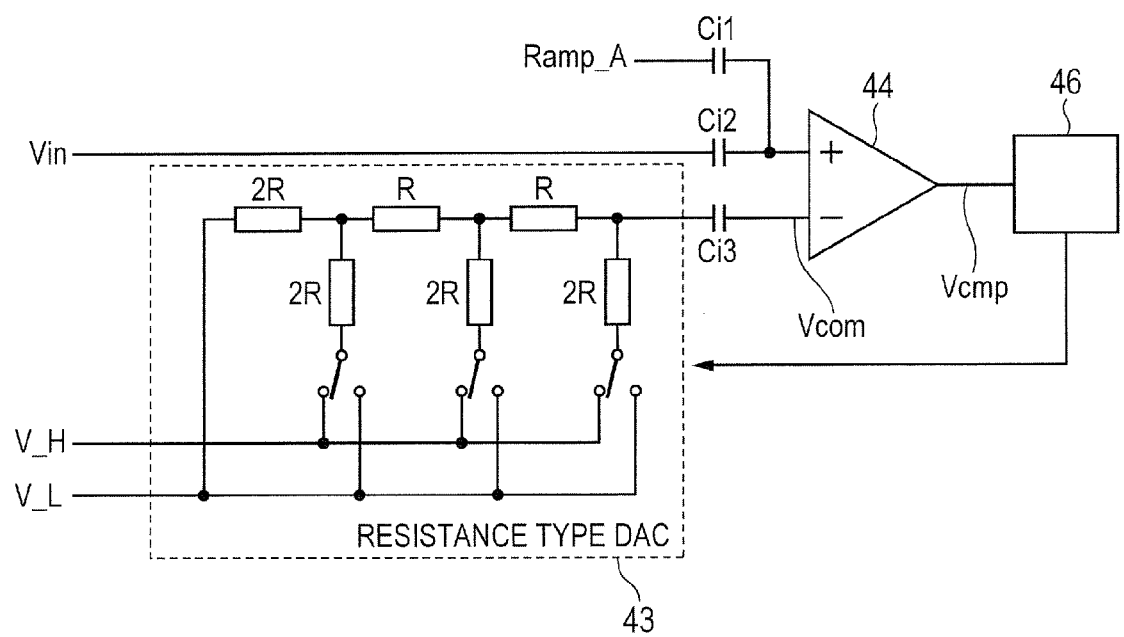
FIG. 9 is a diagram for illustrating a configuration of an AD conversion apparatus according to a sixth embodiment of the present invention.

FIG. 9 is a diagram for illustrating a configuration of an AD conversion apparatus 40 according to a sixth embodiment of the present invention. In this embodiment, a resistance type DAC is used as the circuit of the DAC 43. The DAC 43 is an R-2R ladder digital-to-analog converting circuit in which resistors each having a resistance value R and resistors each having a resistance value 2R that is twice as high as the resistance value R are arranged in a ladder configuration. In this embodiment, the DAC 43 includes four resistors each having the resistance value 2R and two resistors each having the resistance value R. Those resistors are arranged in the ladder configuration so that the resistors connected to the base voltage V_H or the base voltage V_L have the resistance value 2R and the other resistors have the resistance value R.

The DAC 43 has 3-bit inputs, and one terminals of three resistors 2R are connected to the base voltage V_H or the base voltage V_L via three switches. Similarly to the above-mentioned second to fifth embodiments, the respective switches are switched correspondingly to the bit values of respective digits of input binary digital data. When the switches are switched, the method of dividing the input voltage by the resistors arranged in a ladder configuration is changed, and hence the input voltage Vcom of the DAC 43 is changed. Because the input of the DAC 43 in this embodiment is 3 bits, $2^3=8$ kinds of DAC voltages Vdac can be generated. The DAC voltage Vdac is input to the inverting input terminal of the comparison circuit 44 via a capacitor Ci3. Further, the ramp signal Ramp_A is input to the non-inverting input terminal of the comparison circuit 44 via a capacitor Ci1, and the analog signal voltage Vin is similarly input to the non-inverting input terminal of the comparison circuit 44 via a capacitor Ci2. The operation timings and the voltage changes in input and output signals are the same as those in the above-mentioned embodiments, and hence descriptions thereof are omitted.

Also in this embodiment, before the DAC voltage Vdac is held after the first AD conversion, the switch S7 is not connected in a signal path between the DAC 43 and the comparison circuit 44. Consequently, similarly to the third embodiment, the influence of switching noise caused by switching on/off of the switches can be suppressed.

Note that, when the number of stages of the ladder circuit of the DAC 43 is changed, the number of bits to be input can be changed as appropriate. For example, the number of bits may be set to 4 similarly to the second to fifth embodiments.

In the above-mentioned second to sixth embodiments, the ramp signal Ramp_A has been exemplified as a reference signal, but a staircase waveform in which a voltage changes in a staircase manner may be used as the reference signal instead of the ramp signal Ramp_A.

Seventh Embodiment

Figure 10:
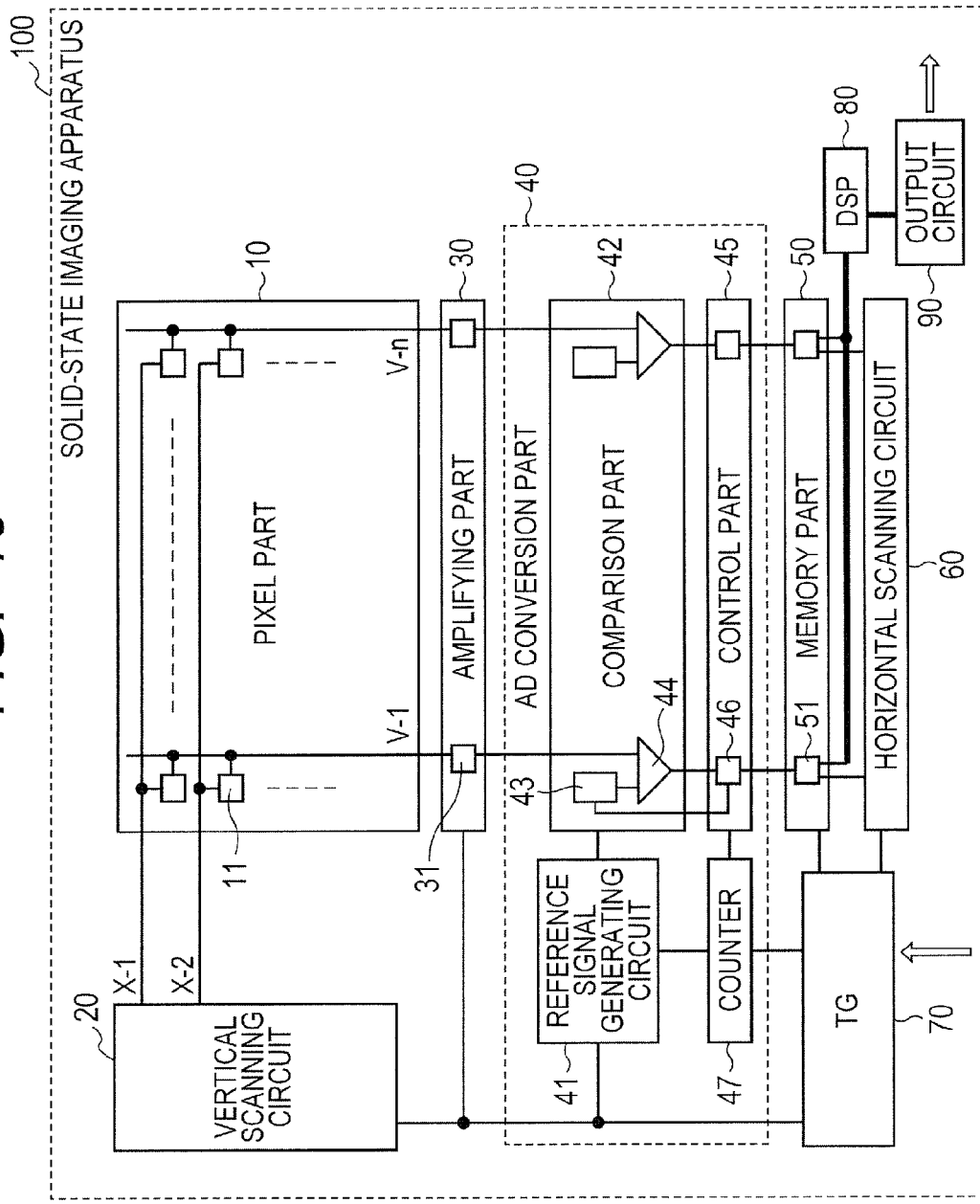
FIG. 10 is a diagram for illustrating a configuration of a solid-state imaging apparatus according to a seventh embodiment of the present invention.

FIG. 10 is a diagram for illustrating a configuration of a solid-state imaging apparatus having the AD conversion apparatus 40 according to the first to sixth embodiments mounted thereon. A solid-state imaging apparatus 100 includes a pixel part 10, a vertical scanning circuit 20, an amplifying part 30, an AD conversion part 40, a memory part 50, a horizontal scanning circuit 60, a timing generating circuit (TG) 70, a digital signal processor (DSP) 80, and an output circuit 90. As the AD conversion part 40 according to this embodiment, the above-mentioned AD conversion apparatus 40 according to the first to sixth embodiments may be used.

The pixel part 10 includes a plurality of pixels arranged in matrix. The pixel 11 is a circuit configured to convert electric charges generated in accordance with the amount of incident light into a voltage signal and output the converted voltage signal. The pixel 11 outputs a base signal N at the time of reset of the pixel circuit (that is, a noise component not including a signal resulting from incident light) and an effective signal S corresponding to the generated electric charges. Pixel rows from which pixel signals are read are sequentially selected based on drive signals (X-1, X-2 . . . ) from the vertical scanning circuit 20. The pixel signals output from the pixels 11 are transmitted to the amplifier circuits 31 in the amplifying part 30 via vertical signal lines (V-1 . . . V-n) for each column.

The pixel signal input to the amplifying part 30 is amplified depending on photographing sensitivity, and is input to the AD conversion part 40. The AD conversion part 40 includes a reference signal generating circuit 41, a comparison part 42, a control part 45, and a counter 47. The comparison part 42 includes the DAC 43 and the comparison circuit 44 that are connected for each pixel column, and the control part 45 includes a control circuit 46 connected for each pixel column. In this manner, the AD conversion part 40 performs AD conversion on signals input from the amplifying part 30 in parallel.

The ramp signal Ramp_A output from the reference signal generating circuit 41 and the counter signal output from the counter 47 are supplied to respective columns in common. Data output from the control circuit 46 (for example, binary digital data of 12 bits) is temporarily stored in the memory circuit 51 connected for each column in the memory part 50, and is transmitted to the DSP 80 based on a control signal from the horizontal scanning circuit 60.

The DSP 80 performs processing of obtaining a difference between the data of the effective signal S and the N-AD data, processing of correcting data based on calibration data of the AD conversion part 40, and other processing. The data output from the DSP 80 is output from the output circuit 90 to an image signal processing unit of an imaging system in which the solid-state imaging apparatus 100 is mounted. The TG 70 controls the solid-state imaging apparatus 100 based on a control signal from the system control unit.

In the above-mentioned embodiment, the amplifying part 30 is connected on the upstream side of the AD conversion part 40. However, in the case where it is not necessary to amplify the pixel signals for each column, the amplifying part 30 may be omitted. Further, a sampling circuit may be added between the pixel part 10 and the amplifying part 30 or between the amplifying part 30 and the AD conversion part 40.

Eighth Embodiment

Figure 11:
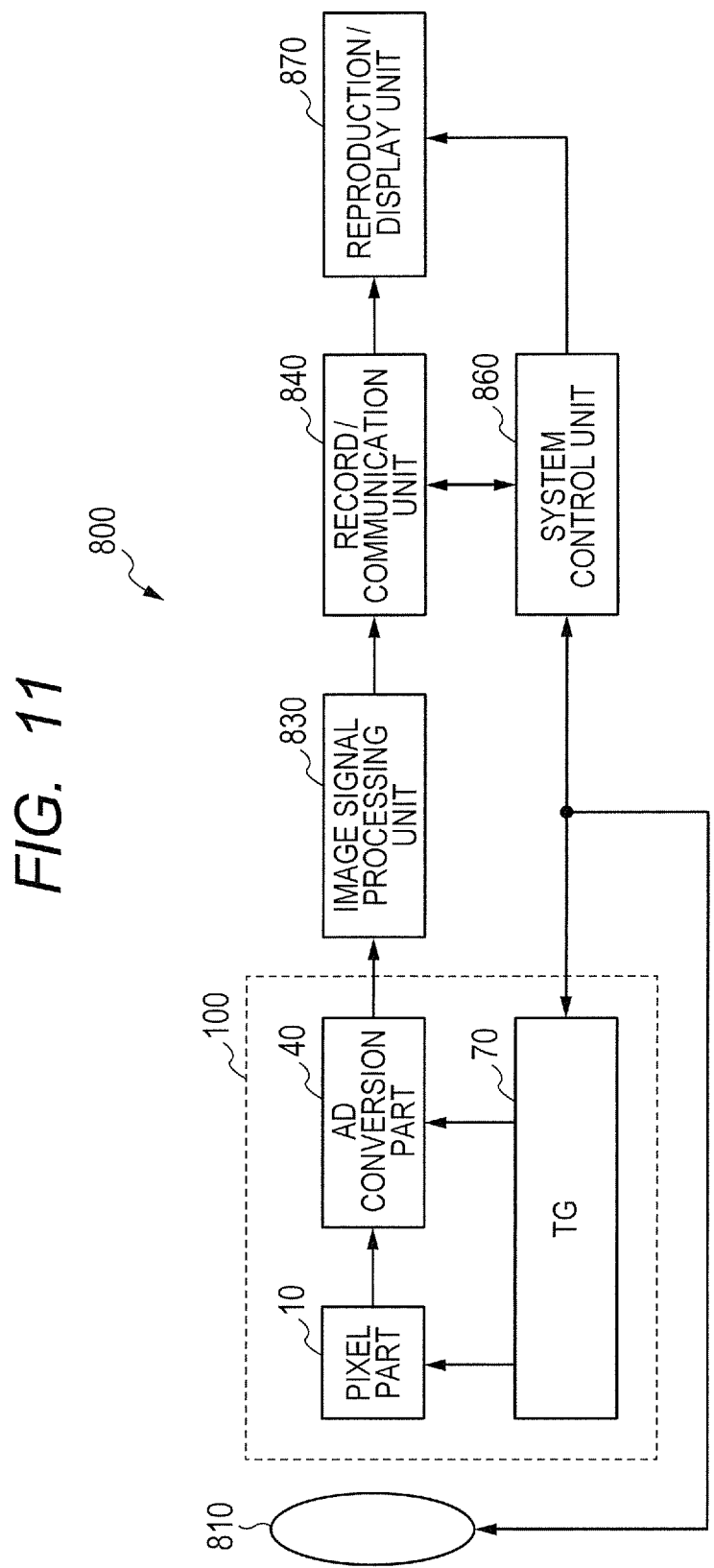
FIG. 11 is a diagram for illustrating an imaging system according to an eighth embodiment of the present invention.

FIG. 11 is a diagram for illustrating a configuration of an imaging system according to an eighth embodiment of the present invention. An imaging system 800 includes, for example, an optical unit 810, a solid-state imaging apparatus 100, an image signal processing unit 830, a record/communication unit 840, a system control unit 860, and a reproduction/display unit 870. The solid-state imaging apparatus 100 includes a pixel part 10, an AD conversion part 40, and a TG 70. As the AD conversion part 40 according to this embodiment, the AD conversion apparatus 40 according to the first to sixth embodiments may be used. Further, as the solid-state imaging apparatus 100, the solid-state imaging apparatus 100 according to the seventh embodiment may be used.

The optical unit 810, which is an optical system such as a lens, forms an image of light from a subject on the pixel part 10 of the solid-state imaging apparatus 100 in which a plurality of pixels 11 are arranged in a two-dimensional manner, to thereby form an image of the subject. The TG 70 controls operation timings of circuits in the solid-state imaging apparatus 100, such as the pixel part 10 and the AD conversion part 40. The solid-state imaging apparatus 100 converts an analog signal corresponding to the light whose image is formed on the pixel part 10 into a digital signal by the AD conversion part 40, and outputs the converted digital signal. The signal output from the solid-state imaging apparatus 100 is input to the image signal processing unit 830. The image signal processing unit 830 performs signal processing in accordance with a method determined by a program or the like. The signal obtained through the processing in the image signal processing unit 830 is transmitted to the record/communication unit 840 as image data. The record/communication unit 840 transmits a signal for forming an image to the reproduction/display unit 870, to thereby cause the reproduction/display unit 870 to reproduce or display a moving image or a still image. Further, in response to the signal from the image signal processing unit 830, the record/communication unit 840 communicates to/from the system control unit 860 and records the signal for forming an image in a recording medium (not shown).

The system control unit 860 controls the operation of the imaging system in a comprehensive manner, and controls the drive of the optical unit 810, the TG 70, the record/communication unit 840, and the reproduction/display unit 870. Further, the system control unit 860 includes a memory device (not shown), such as a recording medium. A program and the like necessary for controlling the operation of the imaging system are recorded in the memory device. Further, the system control unit 860 supplies the imaging system 800 with a signal for switching a drive mode in accordance with a user's operation, for example. As specific examples, the system control unit 860 supplies the imaging system 800 with a signal for changing a row to be read or a row to be reset, changing the angle of view accompanying electronic zooming, and shifting the angle of view accompanying electronic image stabilization.

The imaging system 800 according to this embodiment includes the AD conversion apparatus 40 according to the first to sixth embodiments of the present invention or the solid-state imaging apparatus 100 according to the seventh embodiment of the present invention, and hence the accuracy of AD conversion is improved. Consequently, according to the imaging system 800 according to this embodiment, high-quality imaging may be performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-125206, filed Jun. 18, 2014, which is hereby incorporated by reference herein in its entirety.

What is claimed is:

1. An analog-to-digital (AD) conversion apparatus configured to convert an analog signal into a digital signal, comprising:
a reference signal generating circuit configured to output a first reference signal and a second reference signal whose voltages change with time;
a comparison circuit configured to perform a comparison between a voltage of the analog signal and the voltage of the first reference signal;
a control circuit configured to generate and output digital data based on the comparison;
a digital-to-analog converter configured to generate, using the second reference signal, a signal whose voltage changes with time from a comparison base voltage, the comparison base voltage being based on the digital data, and configured to output the signal to the comparison circuit; and
a counter configured to generate a count value by measuring an elapsed time,
wherein the comparison circuit is further configured to perform a comparison between the voltage of the analog signal and the signal output from the digital-to-analog converter,
wherein the counter obtains a first count value by measuring a time from when changing of the voltage of the first reference signal with time starts, to when a magnitude relationship between the voltage of the analog signal and the voltage of the first reference signal, which are input to the comparison circuit, is changed,
wherein the digital data has a value based on the first count value.

2. The AD conversion apparatus according to claim 1, wherein the counter obtains a second count value by measuring a time from when changing of the voltage of the second reference signal with time starts, to when a magnitude relationship between the voltage of the analog signal and the voltage of the second reference signal, which are input to the comparison circuit, is changed.

3. The AD conversion apparatus according to claim 2, wherein the analog signal is converted into the digital signal by combining the digital data based on the first count value as a higher-order bit and the digital data based on the second count value as a lower-order bit.

4. The AD conversion apparatus according to claim 3, wherein the control circuit sets a value obtained by shifting the first count value by at least 1 bit as a value of the high-order bit.

5. The AD conversion apparatus according to claim 1,
wherein the comparison circuit has one input terminal configured to receive the analog signal, and another input terminal configured to selectively receive either one of an output signal of the digital-to-analog converter and an output signal of the reference signal generating circuit, and
wherein, when the reference signal generating circuit is selected so that the first reference signal is input to the comparison circuit from the reference signal generating circuit, the comparison circuit compares the analog signal and the first reference signal.

6. The AD conversion apparatus according to claim 1,
wherein the comparison circuit has one input terminal configured to receive the analog signal, and another input terminal configured to receive an output signal of the digital-to-analog converter, and
wherein, when the first reference signal output from the reference signal generating circuit is input to the comparison circuit via the digital-to-analog converter, the comparison circuit compares the analog signal and the first reference signal.

7. The AD conversion apparatus according to claim 6, wherein, before the voltage of the analog signal and the voltage of the first reference signal are compared to each other, the digital-to-analog converter inputs a voltage generated with a value of a most significant bit being 1 to the comparison circuit so that the voltage is compared to the analog signal, to thereby determine a value of a most significant bit of the analog signal.

8. The AD conversion apparatus according to claim 1,
wherein the comparison circuit has one input terminal configured to receive the analog signal and an output signal of the digital-to-analog converter,
wherein the AD conversion apparatus further comprises:
a switch connected between another input terminal of the comparison circuit and an output terminal of the comparison circuit; and
a capacitor having one terminal connected to the another input terminal, and
wherein, when the first reference signal is input to another terminal of the capacitor, the comparison circuit compares the analog signal and the first reference signal.

9. The AD conversion apparatus according to claim 8,
wherein, under a state in which the switch is turned on, the analog signal is input to the comparison circuit, and an offset voltage of the comparison circuit is held in the capacitor, and
wherein, after the switch is turned off, the first reference signal is input to the comparison circuit.

10. The AD conversion apparatus according to claim 1, wherein, before the comparison circuit compares the voltage of the analog signal and the voltage of the first reference signal, the comparison circuit compares a base signal of a signal source configured to supply the analog signal and the second reference signal to convert the base signal into the digital signal.

11. The AD conversion apparatus according to claim 10, wherein, in the comparison between the base signal and the second reference signal, the second reference signal has an offset voltage added thereto.

12. The AD conversion apparatus according to claim 1, wherein the first reference signal is larger than the second reference signal in voltage change rate with respect to time.

13. The AD conversion apparatus according to claim 1, wherein the second reference signal is generated by dividing the voltage of the first reference signal.

14. The AD conversion apparatus according to claim 1, wherein the digital-to-analog converter comprises a capacitance type digital-to-analog converter comprising a plurality of capacitors having binary weighted capacitance values.

15. The AD conversion apparatus according to claim 1, wherein the digital-to-analog converter comprises an R-2R ladder type digital-to-analog converter comprising a resistor having a first resistance value and a resistor having a resistance value that is twice as large as the first resistance value, which are connected in a ladder configuration.

16. A solid-state imaging apparatus, comprising:
a pixel part configured to output an analog signal corresponding to incident light; and
the AD conversion apparatus according to claim 1 configured to convert the analog signal into a digital signal.

17. An imaging system, comprising:
a pixel part configured to output an analog signal corresponding to incident light;
the AD conversion apparatus according to claim 1 configured to convert the analog signal into a digital signal; and
a signal processing unit configured to process the digital signal.

* * * * *